US006507943B1

(12) United States Patent
Kelem

(10) Patent No.: US 6,507,943 B1
(45) Date of Patent: Jan. 14, 2003

(54) METHOD OF COMPRESSING A BITSTREAM OF AN FPGA

(75) Inventor: Steven H. Kelem, Los Altos Hills, CA (US)

(73) Assignee: Xilinx, Inc., San Jose, CA (US)

( * ) Notice: Subject to any disclaimer, the term of this patent is extended or adjusted under 35 U.S.C. 154(b) by 139 days.

(21) Appl. No.: 09/670,960

(22) Filed: Sep. 26, 2000

(51) Int. Cl.[7] .............................................. G06F 17/50
(52) U.S. Cl. ...................................................... 716/16
(58) Field of Search ........................ 716/16–5; 365/236, 365/230; 326/39, 40, 41

(56) References Cited

U.S. PATENT DOCUMENTS

| | | | | |
|---|---|---|---|---|
| 5,426,379 A | * | 6/1995 | Trimberger | 326/38 |
| 5,430,687 A | * | 7/1995 | Hung et al. | 365/189.04 |
| 5,923,614 A | * | 7/1999 | Erickson et al. | 326/38 |
| 6,191,614 B1 | * | 2/2001 | Schultz et al. | 326/38 |
| 6,204,687 B1 | * | 3/2001 | Schultz et al. | 326/38 |
| 6,308,311 B1 | * | 10/2001 | Carmichael et al. | 716/16 |

OTHER PUBLICATIONS

Xilinx, Inc. "The Programmable Logic Data Book," 1998, available from Xilinx, Inc., 2100 Logic Drive, San Jose, CA 95124.

Xilinx Application Note: "Virtex Configuration Architecture Advanced User's Guide", Virtex Series XAPP151 (v1.4) Aug. 3, 2000.

* cited by examiner

*Primary Examiner*—Vuthe Siek
*Assistant Examiner*—Binh Tat
(74) *Attorney, Agent, or Firm*—William L. Paradise; Edel M. Young

(57) ABSTRACT

An FPGA includes a configuration control circuit having an internal memory that stores default configuration data which may configure the some or all of FPGA's logic blocks into a default state. A compressed bitstream includes one or more frame control bits indicative of whether corresponding configuration data is included in the bitstream. During configuration of the FPGA, the compressed bitstream is provided to the configuration control circuit from the external memory. As each frame control bit is received, its logic state is determined. If the frame control bit indicates that corresponding configuration data is included in the bitstream, the corresponding configuration data is read from the bitstream into a frame register. If, on the other hand, the frame control bit indicates that corresponding configuration data is not in the bitstream, default configuration data is read from the internal memory into the frame register. When full, the frame register writes the configuration data to a selected column of a configuration memory array.

25 Claims, 5 Drawing Sheets

METHOD OF COMPRESSING A BITSTREAM OF AN FPGA

FIELD OF THE INVENTION

This invention relates generally to programmable logic devices and specifically to configuring a field programmable gate array (FPGA).

BACKGROUND OF THE INVENTION

Referring to FIG. 1, a typical Field Programmable Gate Array (FPGA) 10 includes an array of configurable logic blocks (CLBs) 11 surrounded by input/output blocks (IOBs) 12 and embedded in a programmable interconnect structure 13 having a plurality of programmable switch matrixes (PSMs) 14. Columns containing only IOBs 12, e.g., cols. 1 and 6, are referred to as IOB columns, and columns containing CLBs 11 interposed between IOBs 12, e.g., cols. 2–5, are referred to as CLB columns. For simplicity, the FPGA 10 is shown in FIG. 1 to include 16 CLBs 12 surrounded by 20 IOBs 11 in a 6×6 array, although the number of CLBs 11 and IOBs 12 may vary. In some architectures, CLBs 11 maybe defined to include adjacent portions of programmable interconnect structure 13. In actual architectures, the corner IOBs 11 may be omitted, and replaced with other circuitry such as, for instance, power and ground pads.

CLBs 11 are individually programmable to implement a variety of logic functions. IOBs 12 drive various signals between CLBs 11 and I/O pins (not shown) of FPGA 10, and programmable interconnect structure 13 (and PSMs 14) route signals between various CLBs 11 and IOBs 12. Together, CLBs 11, IOBs 12, and PSMs 14 can be programmed to implement one or more desired logic designs ranging from simple adders and multipliers to more complex structures such as microprocessors. CLBs 11, IOBs 12, and PSMs 14 of FPGA 10 are programmed by loading configuration data into an associated configuration memory array to control various switches and multiplexers therein to implement desired logic functions.

FIG. 2 shows an FPGA 20 having a configuration memory array 21 that may be used to store configuration data for the CLBs 11 and IOBs 12 shown in FIG. 1. Configuration memory array 21 includes a plurality of tiles 22a–22d that store configuration data for corresponding CLBs 11 and IOBs 12 of FIG. 1. Specifically, each tile 22a includes a plurality of columns of configuration bit cells (not shown) to store a plurality of configuration data frames for a corresponding CLB 11, each tile 22b includes a plurality of columns of configuration bit cells (not shown) to store a plurality of configuration data frames for a corresponding IOB 12 on the left and right sides of FPGA 10, i.e., cols. 1 and 6, and each tile 22c includes a plurality of columns of configuration bit cells (not shown) to store a plurality of configuration data frames for a corresponding IOB 12 on the top and bottom of FPGA 10, i.e., rows 1 and 6. The corner tiles 22d each include a plurality of columns of configuration bit cells (not shown) to store configuration data for corner IOBs 12 and/or for other FPGA elements such as ground and power circuitry. Columns including tiles 22a and 22c in array 21 are referred to as CLB tile columns, and may store configuration data for a corresponding CLB column of FIG. 1. Similarly, columns including tiles 22b and 22d are referred to as IOB columns, and may store configuration data for a corresponding IOB column of FIG. 1.

The configuration data is typically downloaded from a host system such as a personal computer or workstation and stored in an external memory 23. Upon power-up, the configuration data is read from external memory 23 to FPGA 20 as a serial bitstream. The serial bitstream is received into a configuration access port (CAP) 15, and provided in frames to a frame register 24. When frame register 24 is full, frames of configuration data are written to a column of configuration bit cells in array 21 selected by an address decoder 25 in a well-known manner. Subsequent frames of configuration data are then loaded into frame register 24 which, when full, loads the frames into another column of configuration bit cells, and so on, until array 21 is programmed.

As the size and complexity of FPGA devices increase, so does the size of the configuration bitstream which, in turn, requires larger external memory to store the configuration bitstream. As the number of configuration bits has increased from several thousand bits to several hundred thousand bits, and may soon increase beyond a million bits, the external memory is becoming undesirably large, thereby consuming more and more valuable board area. Therefore, it would be desirable to reduce the size of the external memory to conserve board area.

SUMMARY OF THE INVENTION

In accordance with the present invention, an FPGA includes a configuration control circuit having an internal memory that stores default configuration data which may configure some or all of FPGA's logic blocks (e.g., IOBs and CLBs) into a default state. A compressed bitstream includes one or more frame control bits indicative of whether corresponding configuration data is included in the bitstream. During configuration of the FPGA, the compressed bitstream is provided to the configuration control circuit from the external memory. As each frame control bit is received, its logic state is determined. If the frame control bit indicates that corresponding configuration data is included in the bitstream, the corresponding configuration data is read from the bitstream into a frame register. If, on the other hand, the frame control bit indicates that corresponding configuration data is not in the bitstream, default configuration data is read from the internal memory into the frame register. When full, the frame register writes the configuration data to a selected column of a configuration memory array.

Each time default configuration data is retrieved from the internal memory, corresponding configuration data may be omitted from the bitstream, thereby reducing the size of the bitstream. Because the same default configuration data stored in the internal memory may be used to configure many FPGA logic blocks, the size of the internal memory is minimal. Where it is desired to configure many FPGA logic blocks into the default state, thereby writing the same default configuration data from internal memory into many configuration memory array tiles, the reduction in configuration bitstream size may be significant. The resultant compressed bitstream requires less external memory for storage, thereby allowing for a reduction in external memory size and, thus, conserving board area.

Like components in the Figures are similarly labeled.

DETAILED DESCRIPTION OF THE INVENTION

Figure 1:
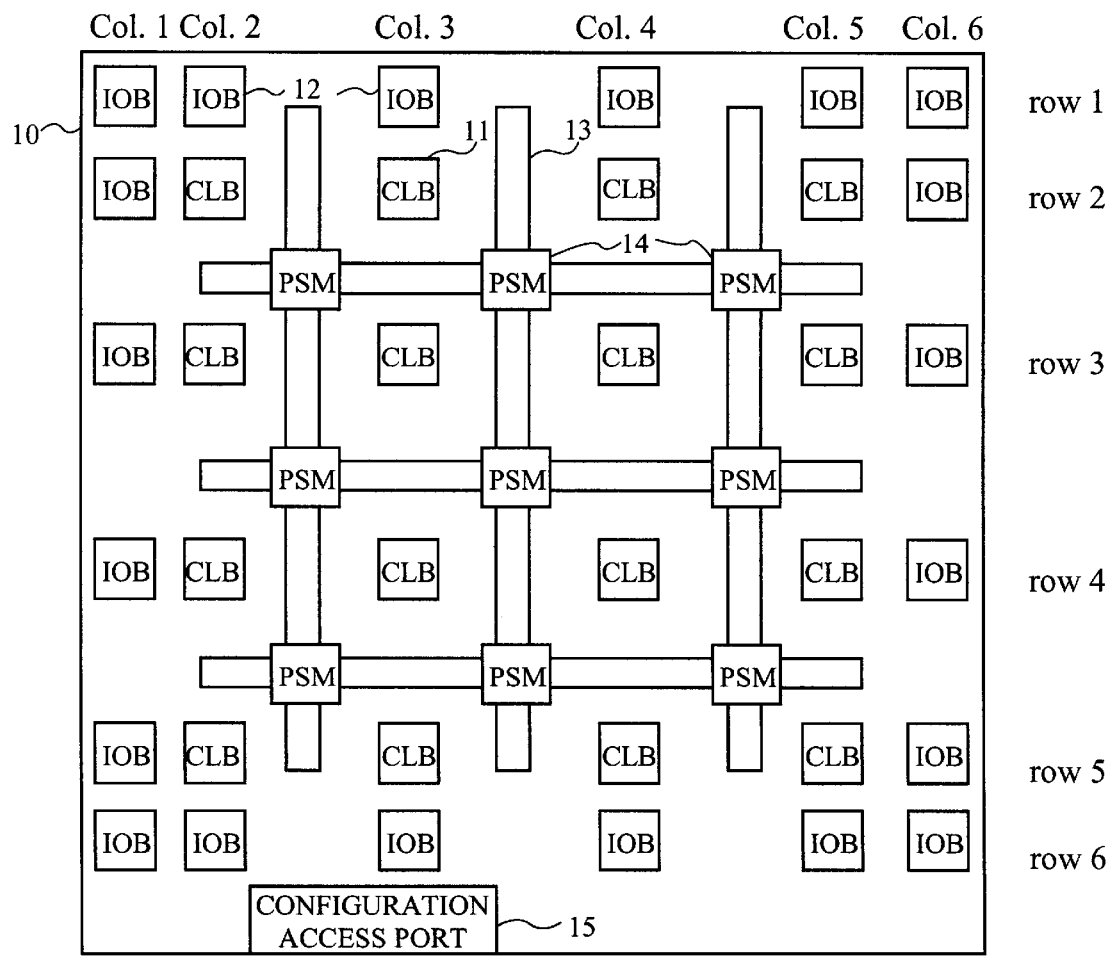
FIG. 1 is a block diagram of a conventional FPGA which may be configured in accordance with the present invention.
Figure 3:
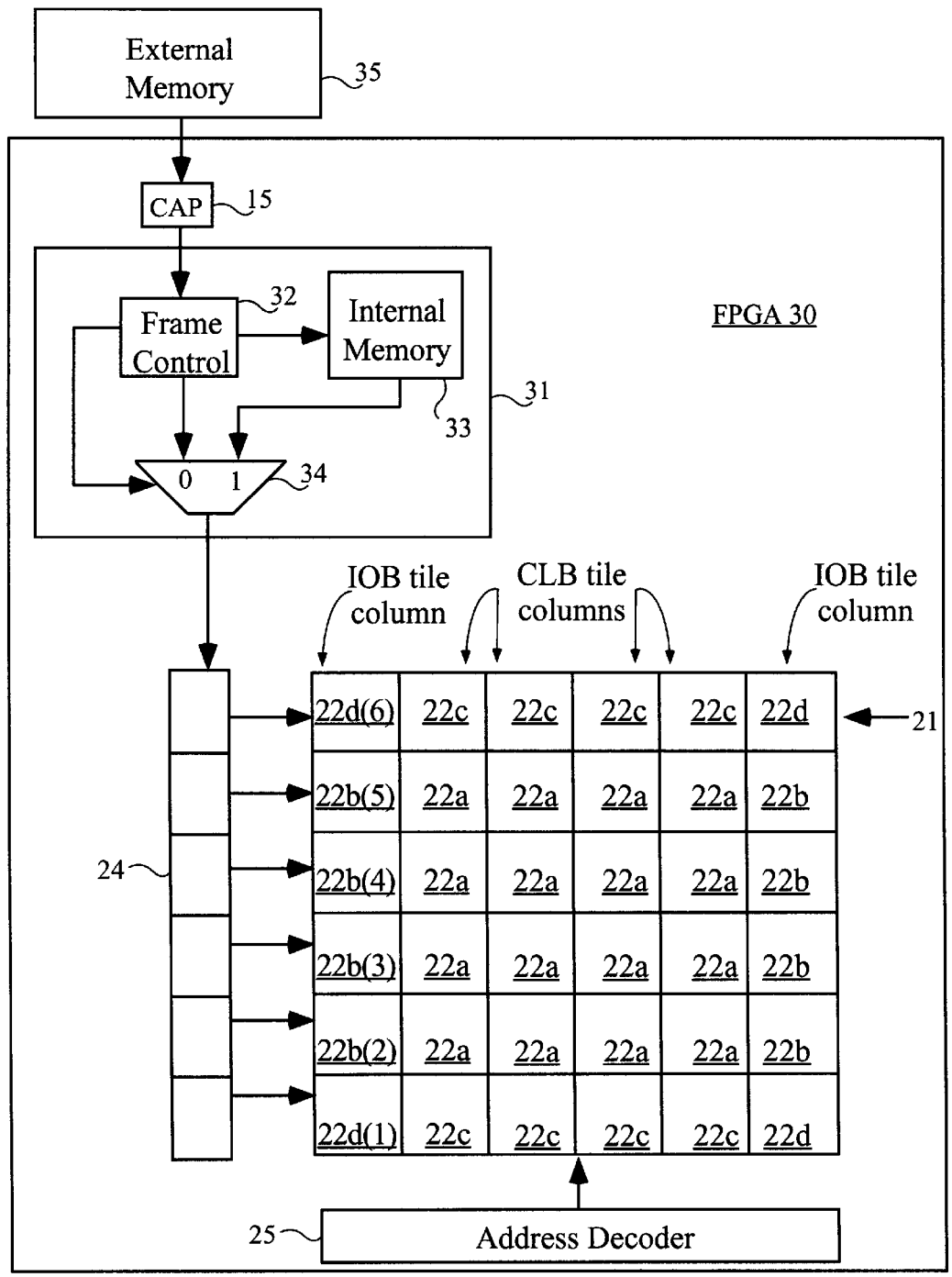
FIG. 3 is a block diagram of an FPGA including a configuration control circuit in accordance with one embodiment of the present invention.

FIG. 3 shows an FPGA architecture 30 in accordance with one embodiment of the present invention. FPGA 30 is shown to include CAP 15, configuration memory array 21, frame register 24, address decoder 25, and a configuration control circuit 31. Configuration array 21, which may be any conventional non-volatile memory array such as DRAM, stores configuration data frames for corresponding CLBs and IOBs. For simplicity, configuration array 21 is shown in FIG. 3 as including 2 IOB tile columns having tiles 22b and 22d and 4 CLB tile columns having tiles 22a and 22c that may be used to store configuration data for respective IOB columns and CLB columns shown, for instance, in FIG. 1. However, in actual embodiments, FPGA 30 may include any number of IOBs and CLBs, and therefore the size of configuration array 21 may vary accordingly. In one embodiment, each IOB column includes 12 IOBs, and each CLB column includes 4 CLBs interposed between two IOBs at the top of the column and two IOBs at the bottom of the column.

Similarly, tiles 22a–22d may include any number of columns of configuration bit cells (not shown in FIG. 3 for simplicity) to store corresponding configuration data frames, the size of which may also vary between embodiments. In one embodiment, each tile 22b stores 54 18-bit configuration data frames, and each tile 22a and 22c stores 48 18-bit configuration data frames. Further, in actual embodiments, the corner IOBs 12 shown in FIG. 1 may be replaced with other circuitry such as, for instance, power and ground pads. In such embodiments, configuration data may not be stored in corresponding corner tiles 22d of configuration array 21.

Frame register 24 is a conventional shift register and is preferably the same length as the entire column of configuration array 21, although other frame register sizes may be used. Address decoder 25 selects a column of configuration memory array 21 in which to write configuration data from frame register 24 in a well known manner. In some embodiments, address decoder 25 initially selects a center column of configuration array 21 for writing configuration data, and then sequentially selects columns on alternating sides of the center column, although other column selection schemes may be used. In some embodiments, FPGA 30 is a Virtex FPGA device available from Xilinx, Inc., although other FPGA architectures may be used. Additional information regarding FPGA architectures generally can be found in "The Programmable Logic Data Book 1998", published in 1998 by Xilinx, Inc., and available from Xilinx, Inc., 2100 Logic Drive, San Jose, Calif. 95124, incorporated herein by reference. Additional information regarding configuration arrays, as well as configuration data frame sizes and types, can be found in an Application Note entitled "Virtex™ Configuration Architecture Advanced User's Guide," published in 2000 by and available from Xilinx, Inc., also incorporated herein by reference.

Configuration control circuit 31 is coupled between CAP 15 and frame register 24, and includes a frame control circuit 32, an internal memory 33, and a multiplexer 34. Internal memory 33, which may be any suitable non-volatile memory, and in one embodiment is a serial PROM, stores one or more frames of default configuration data. In some embodiments, internal memory 33 is the same width as the configuration data frames. In other embodiments, internal memory 33 is the same width as frame register 24. The default configuration data stored in internal memory 33 implements a predetermined default configuration state, such as a safe state, for selected IOBs and CLBs.

In accordance with the present invention, a configuration bitstream stored in external memory 35 includes one or more frame control bits that indicate whether corresponding configuration data is in the configuration bitstream or is instead to be retrieved from internal memory 33. In one embodiment, an asserted frame control bit (e.g., logic 1) indicates that corresponding configuration data is not in the bitstream, and is thus to be retrieved from internal memory 33. Conversely, a de-asserted frame control bit (e.g., logic 0) indicates that the corresponding configuration data is included in the bitstream, and is thus to be retrieved from the bitstream.

Frame control circuit 32 includes an input terminal coupled to receive the configuration bitstream from external memory 35 via CAP 15, and includes an output terminal coupled to a first input terminal of multiplexer 34. Frame control circuit 32 also provides control signals to multiplexer 34 and internal memory 33. In response to the frame control bits, frame control circuit 32 either forwards corresponding configuration data from the configuration bitstream to frame register 24 via multiplexer 34, or instructs internal memory 33 to forward default configuration data to frame register 24 via multiplexer 34. Frame control circuit 32 may be any suitable logic circuit constructed by one skilled in digital logic after reading this disclosure, and is thus not described in detail herein for simplicity. In some embodiments, frame control circuit 32 may include multiplexer 34 or logic circuitry which implements the function of multiplexer 34.

Figure 2:
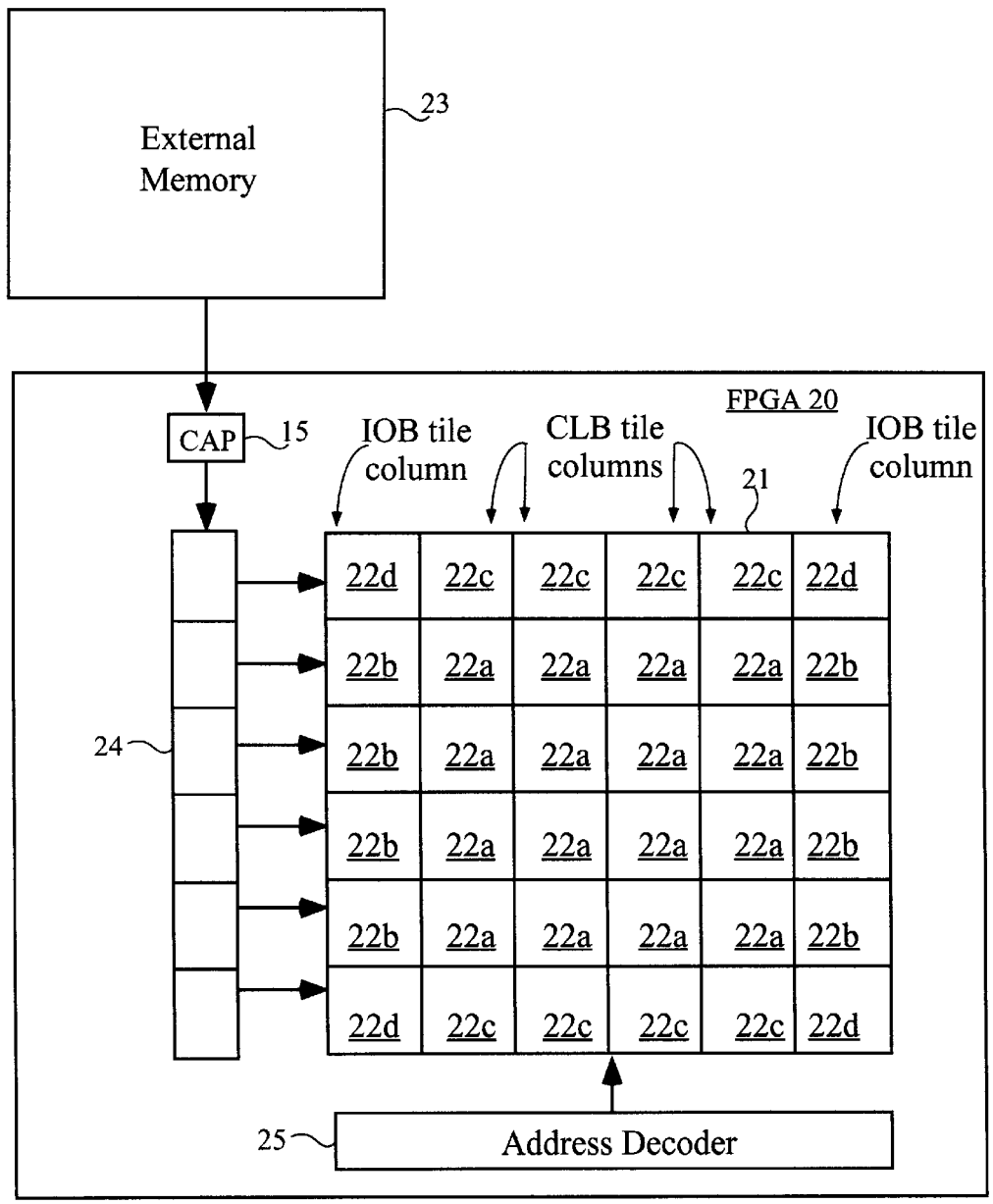
FIG. 2 is a block diagram of an FPGA including a configuration memory array.

For each IOB or CLB that is to be configured into the default state, e.g., the safe state, corresponding default configuration data frames are read into frame register 24 from internal memory 33 rather than from the serial bitstream provided by external memory 35. Thus, each time a default configuration data frame is loaded into frame register 24 from internal memory 33 instead of from the configuration bitstream, a corresponding configuration data frame is omitted from the configuration bitstream, thereby reducing the size of the configuration bitstream. Accordingly, where some or all IOB and/or CLB elements are configured into the default state using default configuration frames retrieved from internal memory 33, the reduction in configuration bitstream size may be significant. Because any reduction in configuration bitstream size allows for a reduction in external memory size, the significant reduction in configuration bitstream size allowed by the present invention allows its associated external memory 35 to be smaller, for example, than external memory 23 associated with conventional FPGA 20 (FIG. 2).

Further, because each IOB is identical in architecture, the same default configuration data frames may be used to configure many IOBs into the default state. Similarly, because each CLB is identical in architecture, the same default configuration data frames may be used to configure many CLBs into the default state. Therefore, because the same copy of default configuration data stored in internal memory 33 may be used to configure some or all associated IOB and/or CLB elements, the size of internal memory 33 is minimal.

Figure 4:
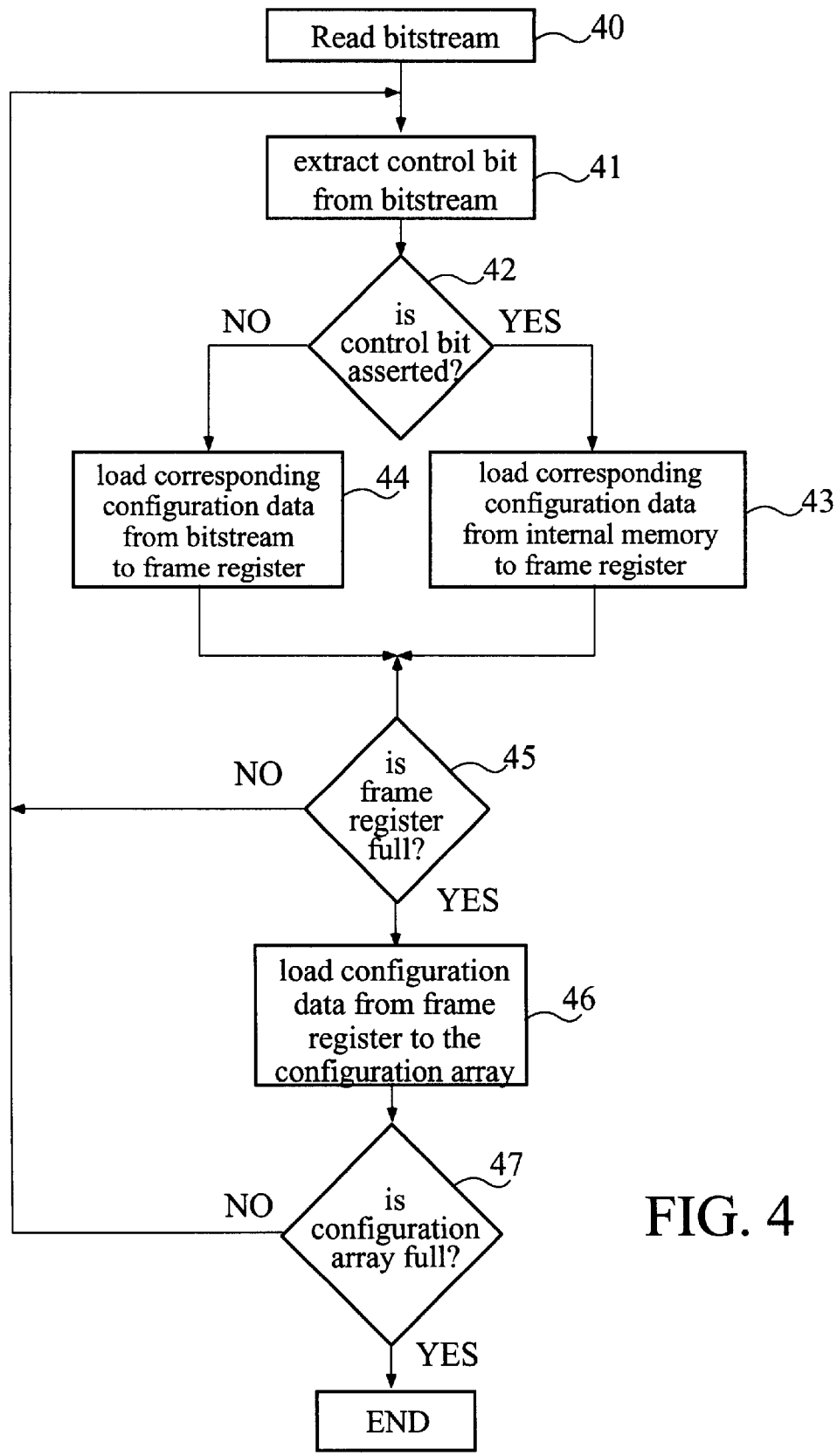
FIG. 4 is a flow chart illustrating one embodiment of configuring the FPGA of FIG. 3.

Configuration of an FPGA using the compressed bitstream in accordance with present embodiments may be best understood with reference to the flow chart of FIG. 4. A configuration bitstream including frame control bits is provided from external memory 35 to frame control circuit 32 via CAP 15 (step 40). A frame control bit is extracted from the bitstream, and its logic state is determined (step 41). If the frame control bit is asserted, as determined in step 42, frame control circuit 32 instructs internal memory 33 to read out a default configuration data frame to frame register 24 via multiplexer 34. If, on the other hand, the frame control bit is de-asserted, frame control circuit 32 forwards a corresponding configuration data frame from the bitstream into frame register 24 via multiplexer 34 (step 44). This process continues until frame register 24 is full, as tested in step 45. When frame register 24 is full, configuration data frames in frame register 24 are written to a selected column of configuration memory array 21 (step 46). If configuration memory array 21 is not full, as tested in step 47, then subsequent configuration data frames are loaded into frame register 24 as described above with respect to steps 41–45, and then loaded into another column of configuration memory array 21 (step 46), and so on, until configuration memory array 21 is full.

Figure 5:
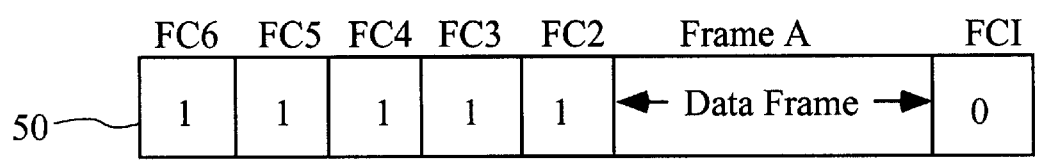
FIG. 5 illustrates a configuration bitstream in one embodiment of the present invention.

For example, FIG. 5 shows a portion 50 of an exemplary configuration bitstream in one embodiment of the present invention that includes configuration data and frame control bits corresponding to one column of configuration array 21. Each of the 6 frame control bits FC1–FC6 indicates whether a configuration data frame for a corresponding tile 22 in the selected column is included in the bitstream. The first control bit FC1, which may, for example, correspond to a first tile frame in tile 22d(1), is de-asserted to logic 0 to indicate that a corresponding configuration data frame is in bitstream portion 50. In response to FC1, frame control circuit 32 forwards configuration data Frame A from bitstream portion 50 to frame register 24 via multiplexer 34.

Frame control bit FC2, which may, for example, correspond to the first tile frame in tile 22b(2), is asserted to logic 1 to indicate that corresponding configuration data is not in bitstream portion 50. In response to FC2, frame control circuit 32 instructs internal memory 33 to read out a default configuration data frame to frame register 24 via multiplexer 34. Because the next 4 frame control bits FC3–C6 are asserted to logic 1, the default configuration frame may be loaded into frame register 24 from internal memory 33 four more times to fill frame register 24. In this example, when full, frame register 24 includes Frame A received from bitstream portion 50 and five copies of the default configuration data frame received from internal memory 33. In this manner, Frame A is written to the selected column in tile 22d(1), and the default configuration data frame is written to the selected column in each of tiles 22b(2)–22b(5) and 22d(6).

Because bitstream portion 50 of FIG. 5 includes five asserted frame control bits FC2–FC6 and only one de-asserted frame control bit FC1, only one frame (Frame A) is included in bitstream portion 50. As a result, bitstream portion 50 is considerably smaller than a conventional bitstream portion that includes 6 configuration data frames. Of course, the present invention allows for a maximum reduction in the size of the configuration bitstream, and thus a minimum size for external memory 35, when all CLB and IOB elements are configured into the default state using default configuration data stored in internal memory 33.

Although described above as corresponding to a single configuration data frame, in other embodiments each frame control bit may correspond to more than one configuration data frame. In some embodiments, each frame control bit corresponds to the number of configuration data frames stored in frame register 24 (e.g., all tile frames in a selected column of configuration array 21). In other embodiments, each frame control bit corresponds to the number of configuration data frames included within one of tiles 22. Of course, the more configuration data bits represented by each frame control bit, the greater the potential reduction in bitstream size, which in turn results in a smaller external memory.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A method for configuring a field programmable gate array (FPGA), the method comprising:

storing default configuration data in an internal memory of the FPGA;

receiving a configuration bitstream from an external memory into the FPGA, the configuration bitstream including a frame control bit indicative of whether corresponding configuration data is included in the configuration bitstream;

extracting the frame control bit from the configuration bitstream;

if the frame control bit is asserted, loading the default configuration data from the internal memory into a frame register;

if the frame control bit is de-asserted, loading the corresponding configuration data from the configuration bitstream into the frame register; and writing configuration data in the frame register into a configuration memory array of the FPGA.

2. The method of claim 1, wherein the default configuration data configures one or more elements of the FPGA into a default state.

3. The method of claim 2, wherein the one or more element comprise Input/Output Blocks (IOBs).

4. The method of claim 2, wherein the one or more elements comprise Configurable Logic Blocks (CLBs).

5. The method of claim 1, wherein the configuration data is written from the frame register in parallel to a selected column of the configuration memory array.

6. The method of claim 1, wherein the internal memory stores one or more tile frames of default configuration data.

7. The method of claim 1, wherein the configuration bitstream comprises a plurality of frame control bits, each frame control bit indicating whether corresponding configuration data is included in the configuration bitstream.

8. The method of claim 7, wherein each frame control bit corresponds to a tile frame of configuration data.

9. The method of claim 7, wherein each frame control bit corresponds to a plurality of tile frames of configuration data.

10. A method for configuring a field programmable gate array (FPGA), the method comprising:

inserting one or more frame control bits into a configuration bitstream, each frame control bit indicating whether corresponding configuration data is included in the configuration bitstream;

storing default configuration data in an internal memory of the FPGA;

receiving the configuration bitstream from an external memory into the FPGA;

selectively loading into a frame register either default configuration data from the internal memory or corresponding configuration data from the configuration bitstream in response to the frame control bit; and writing configuration data from the frame register into a configuration memory array of the FPGA.

11. The method of claim 10, wherein each frame control bit corresponds to a tile frame of configuration data.

12. The method of claim 10, wherein each frame control bit corresponds to a plurality of tile frames of configuration data.

13. The method of claim 10, further comprising:

if the frame control bit is de-asserted, configuring a selected element of the FPGA using the corresponding configuration data provided from the configuration bitstream; and if the control bit is asserted, configuring the selected element of the FPGA using the default configuration data provided by the internal memory.

14. The method of claim 13, wherein the selected element comprises an Input/Output Block (IOB).

15. The method of claim 13, wherein the selected element comprises a Configurable Logic Block (CLB).

16. A field programmable gate array (FPGA) having a plurality of logic blocks, the FPGA comprising:

a configuration bitstream including one or more frame control bits indicative of whether corresponding configuration data is included in the configuration bitstream;

a configuration memory array; and a configuration control circuit, comprising:

an internal memory to store default configuration data; and means to provide, in response to the frame control bits, either the default configuration data from the internal memory or the corresponding configuration data from the configuration bitstream to the configuration memory array.

17. The FPGA of claim 16, wherein the default configuration data configures selected elements into a default state.

18. The FPGA of claim 17, wherein the selected elements comprise Input/Output blocks (IOBs).

19. The FPGA of claim 16, wherein the selected elements comprise Configurable Logic Blocks (CLBs).

20. The FPGA of claim 16, further comprising a frame register having an input terminal to selectively receive configuration data from either the configuration bitstream or from the internal memory, and having an output port connected to an input port of the configuration memory array.

21. The FPGA of claim 16, wherein the means to selectively provide comprises:

a frame control circuit having an input terminal coupled to receive the configuration bitstream from an external memory, a first control terminal to provide read instructions to the internal memory, a second control terminal to provide a select signal, and an output terminal; and a multiplexer having a first input terminal coupled to the output terminal of the frame control circuit, a second input terminal connected to an output terminal of the internal memory, and a select terminal coupled to receive the select signal.

22. The FPGA of claim 16, wherein the internal memory comprises a serial PROM (SPROM).

23. The FPGA of claim 22, wherein the SPROM stores one or more tile frames of configuration data.

24. The FPGA of claim 23, wherein each frame control bit corresponds to a tile frame of configuration data.

25. The FPGA of claim 23, wherein each frame control bit corresponds to a plurality of tile frames of configuration data.

* * * * *